United States Patent
Wu et al.

(10) Patent No.: US 6,797,630 B1
(45) Date of Patent: Sep. 28, 2004

(54) PARTIAL VIA HARD MASK OPEN ON LOW-K DUAL DAMASCENE ETCH WITH DUAL HARD MASK (DHM) APPROACH

(75) Inventors: Tsang-Jiuh Wu, Taichung (TW); Chen-Nan Yeh, Taipei (TW); Li-Te S. Lin, Hsin-chu (TW); Li-Chih Chao, Yan-mei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 267 days.

(21) Appl. No.: 10/184,735

(22) Filed: Jun. 28, 2002

(51) Int. Cl.[7] .................................... H01L 21/311
(52) U.S. Cl. ................................ 438/700; 438/717
(58) Field of Search ........................ 438/700, 702, 438/703, 706, 717, 634, 637

(56) References Cited

U.S. PATENT DOCUMENTS

| | | | |
|---|---|---|---|
| 5,632,908 A | 5/1997 | Shahid | 216/2 |
| 5,753,417 A | 5/1998 | Ulrich | 430/312 |
| 5,821,169 A | 10/1998 | Nguyen et al. | 438/736 |
| 6,042,996 A | 3/2000 | Lin et al. | 430/313 |
| 6,043,164 A | 3/2000 | Nguyen et al. | 438/736 |
| 6,054,384 A | 4/2000 | Wang et al. | 438/637 |
| 6,156,643 A * | 12/2000 | Chan et al. | 438/638 |
| 6,376,366 B1 * | 4/2002 | Lin et al. | 438/637 |
| 6,479,391 B2 * | 11/2002 | Morrow et al. | 438/706 |
| 6,573,176 B2 * | 6/2003 | Hong | 438/637 |
| 6,686,273 B2 * | 2/2004 | Hsu et al. | 438/638 |
| 2003/0008490 A1 * | 1/2003 | Xing et al. | 438/622 |

* cited by examiner

*Primary Examiner*—Kin-Chan Chen
(74) *Attorney, Agent, or Firm*—Haynes and Boone, LLP

(57) ABSTRACT

A method for forming a dual damascene opening comprising the following steps. A structure having an exposed conductive structure formed therein is provided. An etch stop layer is formed over the structure and the exposed conductive structure. A dielectric layer is formed over the etch stop layer. A hard mask layer is formed over the dielectric layer. The hard mask layer is patterned to form a partially opened hard mask layer. The partially opened hard mask layer having a trench area and a via area. The partially opened hard mask layer within the via area is patterned to form a partial via opened hard mask layer. Simultaneously, the partial via opened hard mask layer within both the trench area and the via area are etched and removed, and the dielectric layer within the via area is partial etched to form a partially opened dielectric layer to: expose a portion of dielectric layer within the trench area; and form a partial via within the partially opened dielectric layer. The partially opened dielectric layer is etched: within the trench area to form a trench; and within the via area to form a final via exposing a portion of etch stop layer. The trench and the final via forming the dual damascene opening.

34 Claims, 5 Drawing Sheets

PARTIAL VIA HARD MASK OPEN ON LOW-K DUAL DAMASCENE ETCH WITH DUAL HARD MASK (DHM) APPROACH

FIELD OF THE INVENTION

The present invention relates generally to semiconductor fabrication and more specifically to methods of forming dual damascene trenches.

BACKGROUND OF THE INVENTION

A dual hard mask approach has been one of the most common scheme for forming dual damascene trenches in low-k dielectric layer etching processes.

One such dual hard mask practice utilizes dual hard masks with oxynitride as the top layer and silicon-carbide as the bottom layer. After the partial trench hard mask open step, the via is partially etched and stops at a buffer layer within the low-k dielectric layer. However, this scheme is not suitable for porous low-k layer dual damascene etching without using such a stop layer.

U.S. Pat. No. 5,821,169 to Nguyen et al. describes a dual damascene etch process by etching the dual damascene shape in to a hardmask and then etching the dual damascene opening into the inter-metal dielectric (IMD) layer without using an etch stop.

U.S. Pat. No. 6,043,164 to Nguyen et al. describes a dual damascene etch process by etching the dual damascene shape into a photoresist (PR) layer and then etching the dual damascene opening into the IMD layer without using an etch stop.

U.S. Pat. No. 6,054,384 to Wang et al. describes a method of etching a plurality of contiguous opening within an integrated circuit with high etch selectivity.

U.S. Pat. No. 5,632,908 to Shahid describes a method of forming an optical fiber support member.

U.S. Pat. No. 6,042,996 to Lin et al. describes a method of fabricating a dual damascene structure including forming a photoresist layer on a dielectric layer.

U.S. Pat. No. 5,753,417 to Ulrich describes a method for forming multi-level profiles from a photoresist mask.

SUMMARY OF THE INVENTION

Accordingly, it is an object of one or more embodiments of the present invention to provide an improved method of forming a dual damascene opening within a dielectric layer.

Other objects will appear hereinafter.

It has now been discovered that the above and other objects of the present invention may be accomplished in the following manner. Specifically, a structure having an exposed conductive structure formed therein is provided. An etch stop layer is formed over the structure and the exposed conductive structure. A dielectric layer is formed over the etch stop layer. A hard mask layer is formed over the dielectric layer. The hard mask layer is patterned to form a partially opened hard mask layer. The partially opened hard mask layer having a trench area and a via area. The partially opened hard mask layer within the via area is patterned to form a partial via opened hard mask layer. Simultaneously, the partial via opened hard mask layer within both the trench area and the via area are etched and removed, and the dielectric layer within the via area is partial etched to form a partially opened dielectric layer to: expose a portion of dielectric layer within the trench area; and form a partial via within the partially opened dielectric layer. The partially opened dielectric layer is etched: within the trench area to form a trench; and within the via area to form a final via exposing a portion of etch stop layer. The trench and the final via forming the dual damascene opening.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Problem Known to the Inventors—Not to Considered Prior Art

In the trench hard mask breakthrough using the prior art dual hard mask practice described above, $CH_xF_y/Ar/O_2$ based chemistry is usually used. The etching to the hard mask is about 2000 Å/minute and to the low-k material can be larger than about 12,000 Å/minute. Thus, due to the high etching rate to the low-k material, the via stop layer will be exposed even when the trench hard mask breakthrough is not completed. Thus, the barrier will be removed during the trench etch and in turn causing copper (Cu) to be exposed and sputtered by plasma.

Initial Structure

Figure 1:
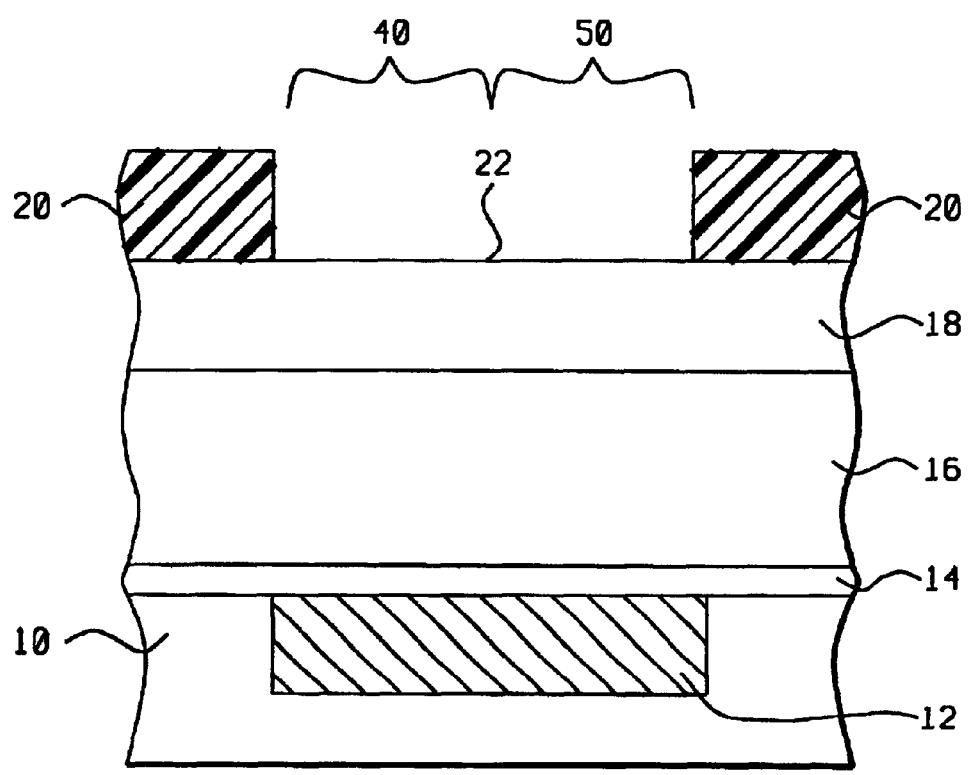
FIGS. 1 to 9 schematically illustrate a preferred embodiment of the present invention.

As shown in FIG. 1, structure 10 includes an exposed metal structure 12. Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Exposed metal structure 12 may be metal lines or metal vias, for example, electrically connected to other devices within structure 10. Metal structure 12 is preferably comprised of copper (Cu), aluminum (Al), gold (Au) or silver (Ag) and is more preferably comprised of Cu.

An etch stop layer 14 is formed over structure 10 and exposed metal structure 12 to a thickness of preferably from about 200 to 600 Å and more preferably from about 300 to 500 Å. Etch stop layer 14 is preferably comprised of nitride, silicon nitride (SiN), oxynitride, silicon oxynitride (SiON) or silicon carbide (SiC) and is more preferably comprised of SiN.

A dielectric/low-k dielectric layer 16 is formed over etch stop layer 14 to a thickness of preferably from about 3000 to 8000 Å and more preferably from about 5000 to 7000 Å. Low-k dielectric layer 16 may be porous or non-porous and is preferably comprised of silicon oxide, silicon oxynitride or silicon nitride and is more preferably comprised of silicon oxide.

A hard mask layer 18 is formed over the low-k dielectric layer 16 to a thickness of preferably from about 2000 to 5000 Å and more preferably from about 3000 to 4000 Å. Hard mask layer 18 is preferably comprised of oxynitride, silicon oxynitride (SiON), carbide, nitride, silicon nitride (SiN) or SiC and is more preferably comprised of SiON or SiC.

A first patterned masking layer 20 is formed over hard mask layer 18 leaving exposed a portion 22 of hard mask layer 18 so that at least a part of exposed hard mask portion 22 overlies at least a portion of metal structure 12. The exposed portion 22 of hard mask layer 18 including a trench area 40 and a via area 50.

The first patterned masking layer 20 may be comprised of photoresist, for example, as shown in the figures.

Partial Hard Mask Layer 18 Open

Figure 2:
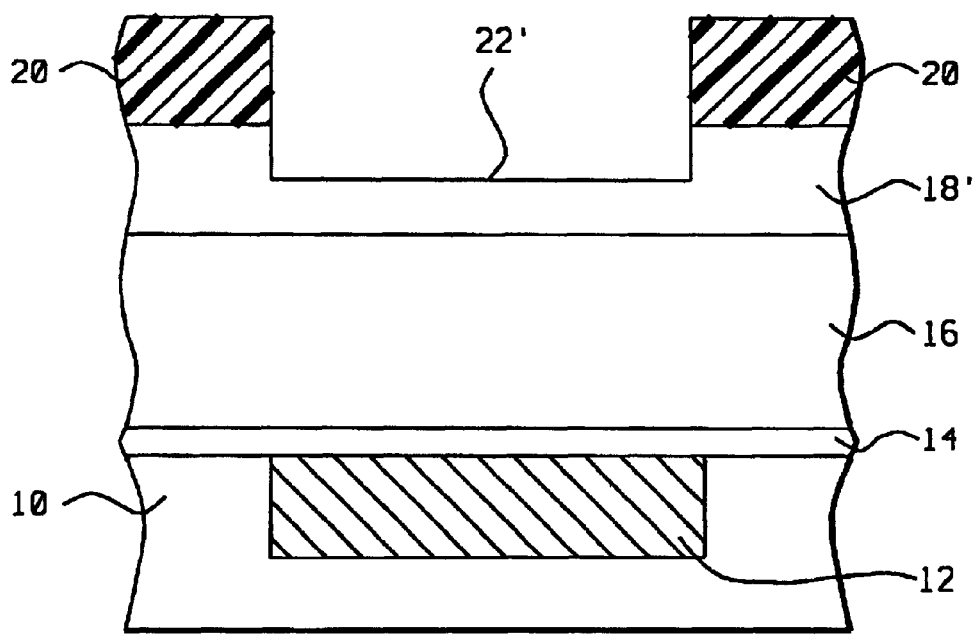

As shown in FIG. 2, using the first patterned masking layer 20 as a mask, hard mask layer 18 is partially etched at the exposed hard mask portion 22 to form partially opened hard mask layer 18' having an exposed portion 22'. Preferably hard mask layer 18 is etched to a depth of from about 1000 to 2500 Å and more preferably from about 1500 to 2000 Å.

Removal of First Patterned Masking Layer 20

Figure 3:
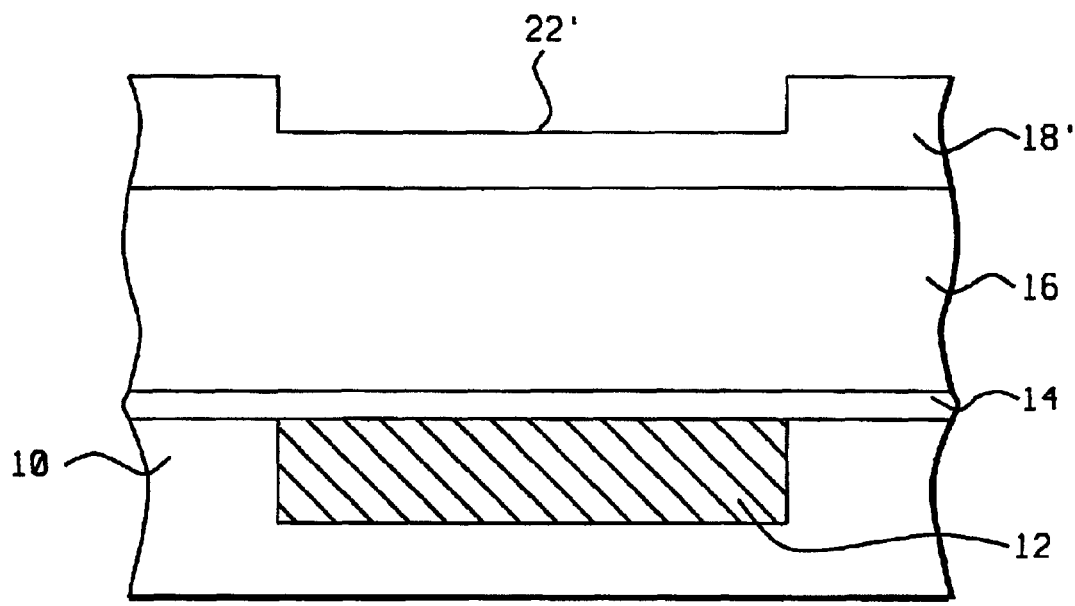

As shown in FIG. 3, the first patterned masking layer 20 is removed by any prior art method suitable to the composition of the first patterned masking layer 20. For example if first patterned masking layer 20 is comprised of photoresist, then the first patterned masking photoresist layer 20 may be removed by stripping.

The structure may then be cleaned.

Formation of Second Patterned Masking Layer 24

Figure 4:
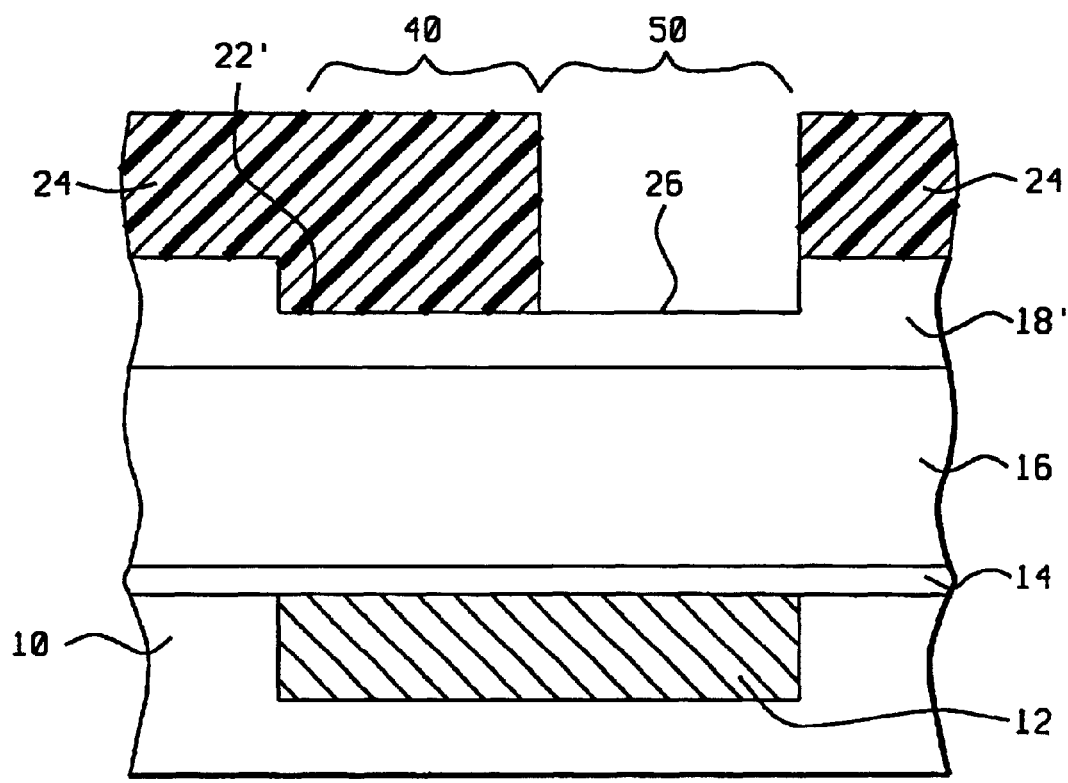

As shown in FIG. 4, a second patterned masking layer 24 is formed over the partially opened hard mask layer 18' leaving exposed a via portion 26/via area 50 of partially opened hard mask layer 18' so that at least a part of partially opened exposed hard mask via portion 26 overlies at least a portion of metal structure 12. The non-exposed portion 22' of partially opened hard mask layer 18' is within the trench area 40. The trench portion 40 and the via portion 50 will comprise the dual damascene structure.

The second patterned masking layer 24 may be comprised of photoresist, for example, as shown in the figures.

Partial Via Hard Mask Layer 18' Open

Figure 5:
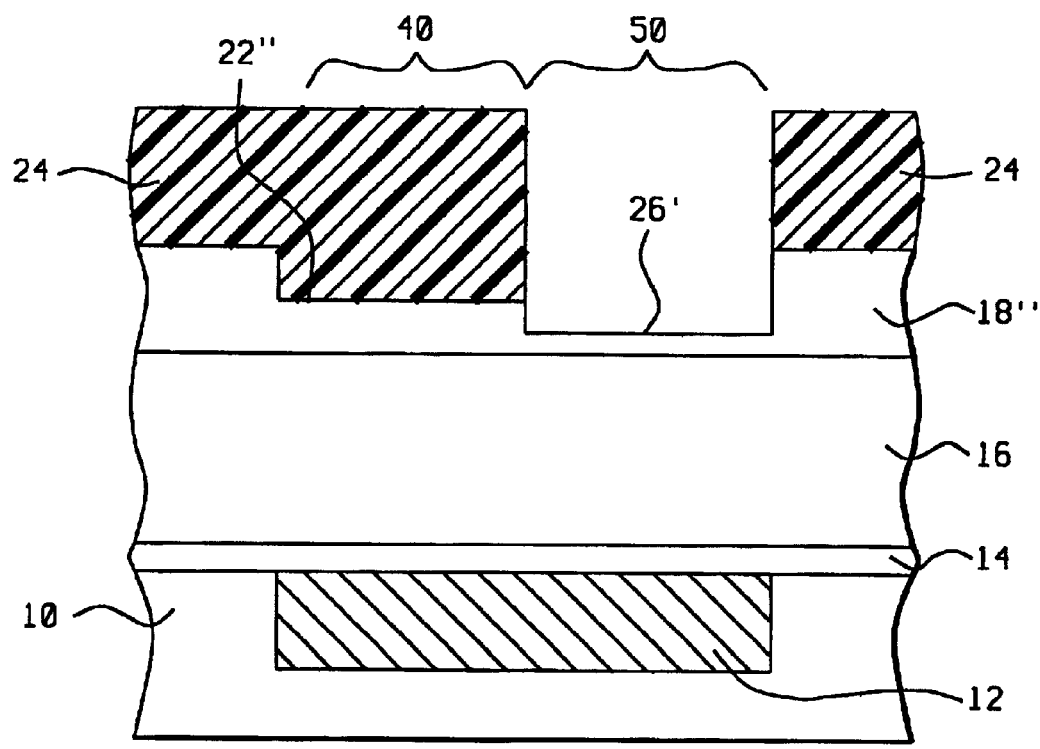

As shown in FIG. 5, using the second patterned masking layer 24 as a mask, partially opened hard mask layer 18' is further etched at the exposed via portion 26 to form partial via opened hard mask layer 18" having an exposed via portion 26'.

Removal of Second Patterned Masking Layer 24

Figure 6:
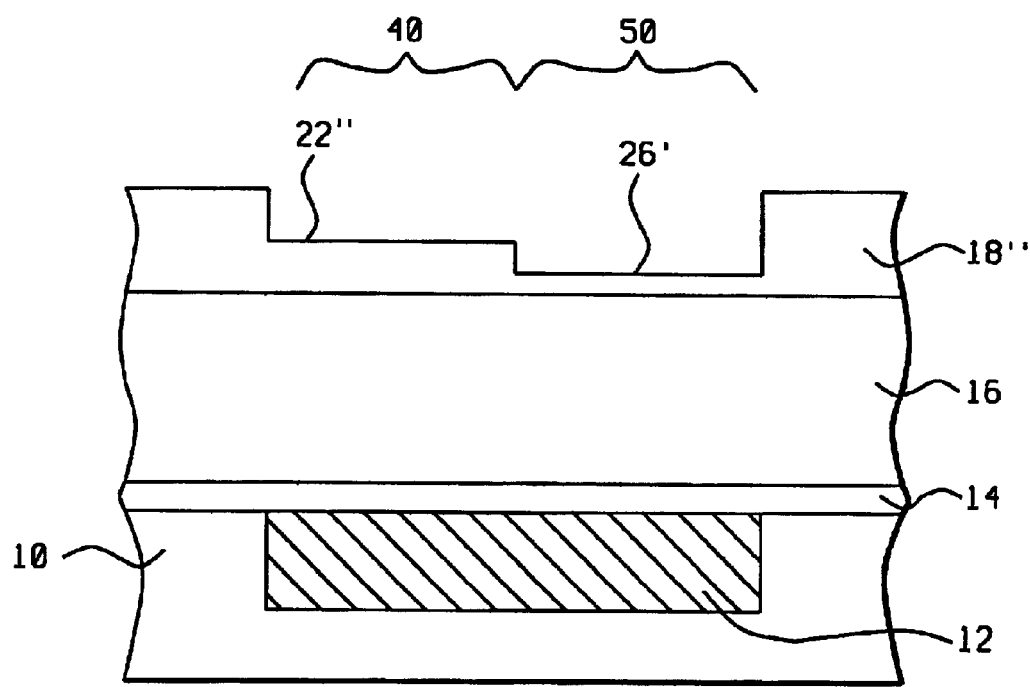

As shown in FIG. 6, the second patterned masking layer 24 is removed by any prior art method suitable to the composition of the second patterned masking layer 20. For example if second patterned masking layer 20 is comprised of photoresist, then the second patterned masking photoresist layer 20 may be removed by stripping.

The structure may then be cleaned.

Trench/Via Hard Mask Breakthrough—Key Step of the Invention

Figure 7:
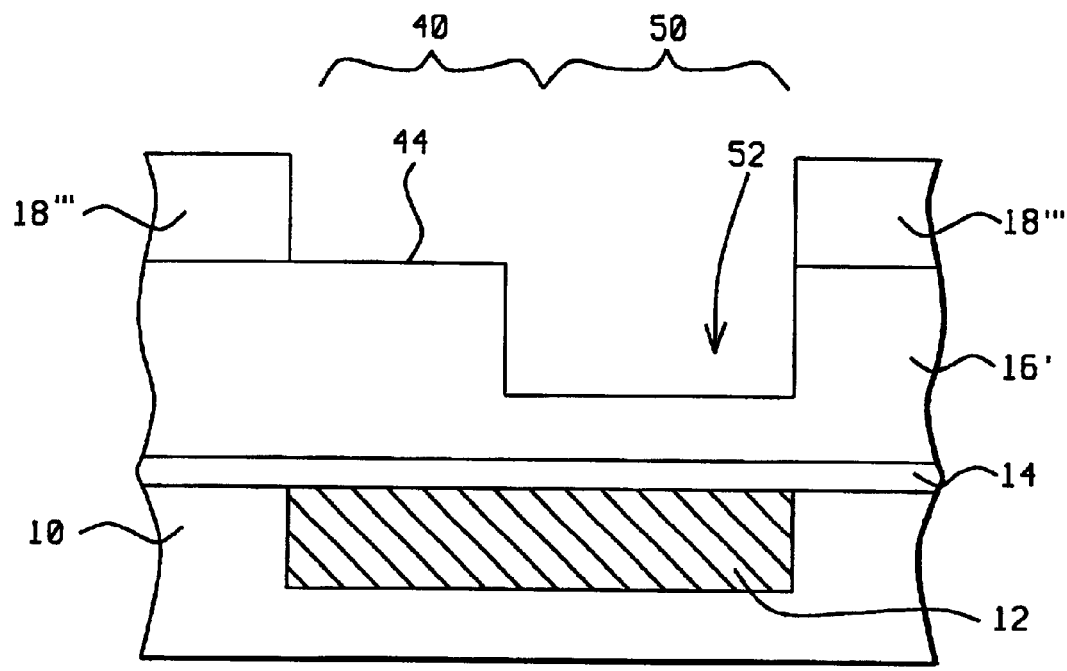

As shown in FIG. 7, partial via opened hard mask layer 18" is simultaneously etched within the trench area 40 and the via area 50 so that the hard mask layer 18" is removed from within the trench area 40 to exposing a portion 44 of low-k dielectric layer 16 within the trench area 40; and the hard mask layer 18" is removed from within the via area 50 as well as a portion of the low-k dielectric layer 16 within the via area 50 to form a partially etched low-k dielectric layer 16' having a partial via 52 This leaves completely etched hard mask layer 18'''.

Trench 42/Via 52' Low-K Layer 16' Etch

Figure 8:
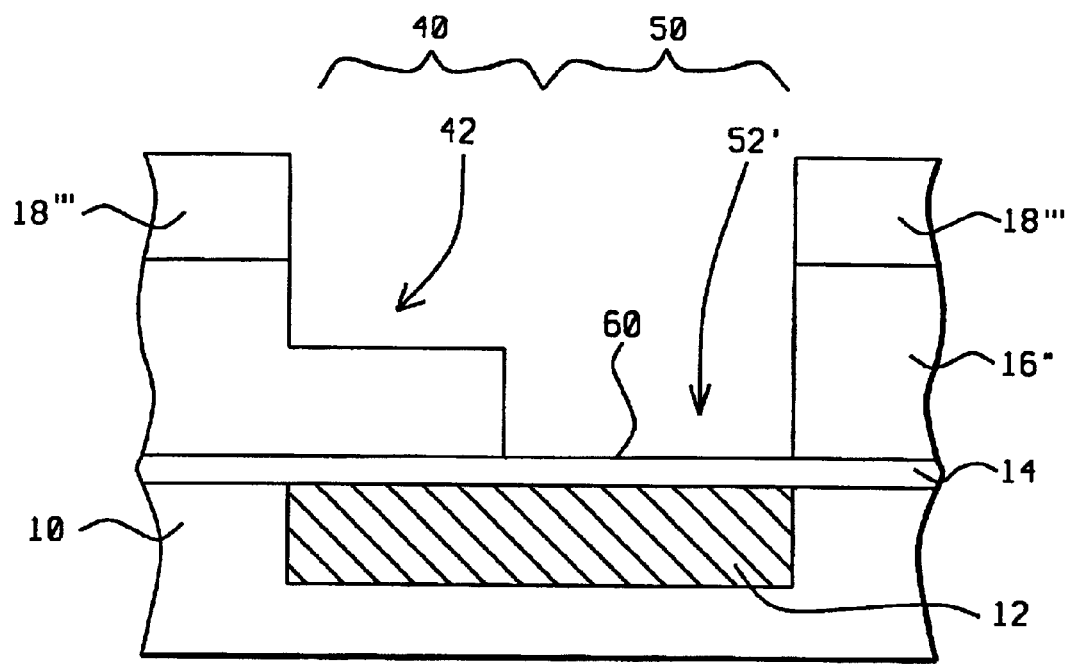

As shown in FIG. 8, the partially etched low-k dielectric layer 16' is etched within the trench area 40 to form a trench 42 having a depth of preferably from about 1500 to 4000 Å below completely etched hard mask layer 18''' and more preferably from about 2500 to 3500 Å below completely etched hard mask layer 18'''. The trench low-k material 16' etch may be timed to set the actual depth of trench 42. The partially etched low-k dielectric layer 16' is also etched within the via area 50 to form a final via 52' exposing a portion 60 of etch stop layer 14 within via area 50. The partially etched low-k material layer 16' is etched simultaneously within the trench area 40 and the via area 50 to form the trench 42 and the final via 52'. The etch depth is controlled by the etching time and the via area 50 will be overetched at the stop layer 14.

In accordance with the method of the present invention, the depth of trench 42, as opposed to the final via 52', is not dependent upon the depth of the partial via 52 at hardmask breakthrough as shown in FIG. 7.

Figure 9:
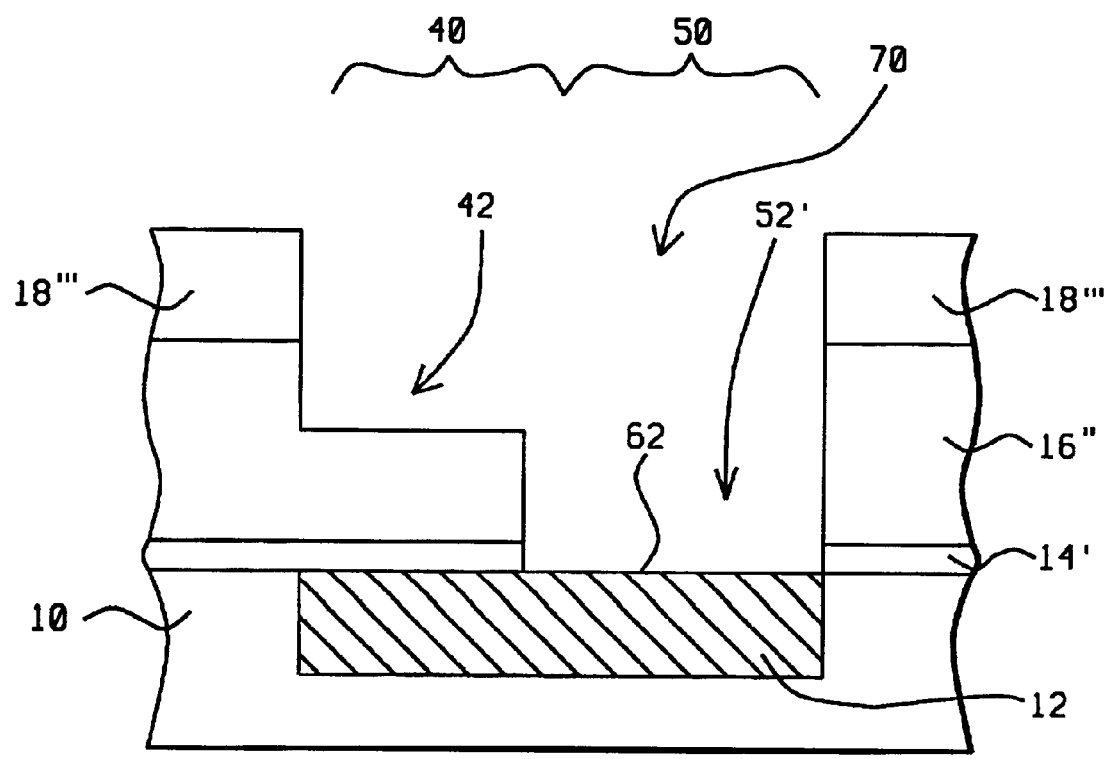

Removal of Exposed Etch Stop Layer Portion 60 As shown in FIG. 9, the exposed etch stop layer portion 60 within the via area 50 is removed by a conventional process to expose a portion 62 of metal structure 12 within the via area 50.

This completes formation of the dual damascene opening 70.

Further processing may then continue.

Advantages of the present Invention

The advantages of one or more embodiments of the present invention include:

1. a 'dual hard mask approach' is made feasible in a low-k dual damascene etch; and 2. a photoresist poison-free etch is achieved While particular embodiments of the present invention have been illustrated and described, it is not intended to limit the invention, except as defined by the following claims.

We claim:

1. A method for forming a dual damascene opening, comprising the steps of:

providing a structure having an exposed conductive structure formed therein;

forming an etch stop layer over the structure and the exposed conductive structure;

forming a dielectric layer over the etch stop layer;

forming a hard mask layer over the dielectric layer;

patterning the hard mask layer to form a partially opened hard mask layer; the partially opened hard mask layer having a trench area and a via area;

patterning the partially opened hard mask layer within the via area to form a partial via opened hard mask layer;

partially etching the dielectric layer within the via area forming: a partially opened dielectric layer, to: expose a portion of dielectric layer within the trench area; and form a partial via within the partially opened dielectric layer; and etching the partially opened dielectric layer: within the trench area to form a trench; and within the via area to form a final via exposing a portion of etch stop layer; the trench and the final via forming the dual damascene opening.

2. The method of claim 1, including the step of removing the exposed etch stop layer portion to expose a portion of the conductive structure within the via opening.

3. The method of claim 1, wherein the structure is a semiconductor substrate and the exposed conductive structure is a metal line or a metal via.

4. The method of claim 1, wherein the exposed conductive structure is comprised of a material selected from the group consisting of: Cu, Al Au and Ag; the etch stop layer is comprised of a material selected from the group consisting of: nitride, silicon nitride, oxynitride, silicon oxynitride and silicon carbide; the dielectric layer is comprised of a material selected from the group consisting of: silicon oxide, silicon oxynitride and silicon nitride; and the hard mask layer is comprised of a material selected from the group consisting of: oxynitride, silicon oxynitride, carbide, nitride, silicon nitride and SiC.

5. The method of claim 1, wherein the exposed conductive structure is comprised Cu; the etch stop layer is comprised of SiN; the dielectric layer is comprised of silicon oxide; and the hard mask layer is comprised of a material selected from the group consisting of: SiON and SiC.

6. The method of claim 1, wherein the etch stop layer has a thickness of from about 200 to 600 Å; the dielectric layer has a thickness of from about 3000 to 8000 Å; and the hard mask layer has a thickness of from about 2000 to 5000 Å.

7. The method of claim 1, wherein the etch stop layer has a thickness of from about 300 to 500 Å; the dielectric layer has a thickness of from about 5000 to 7000 Å; and the hard mask layer has a thickness of from about 3000 to 4000 Å.

8. The method of claim 1, wherein the dielectric layer is porous or non-porous.

9. The method of claim 1, wherein the dielectric layer is porous.

10. The method of claim 1, wherein the dielectric layer is non-porous.

11. The method of claim 1, wherein the hard mask layer is patterned using a first patterned masking layer, and the partially opened hard mask layer is patterned using a second patterned masking layer.

12. The method of claim 1, wherein the hard mask layer is patterned using a first patterned photoresist layer, and the partially opened hard mask layer is patterned using a second patterned photoresist layer.

13. The method of claim 1, including the step of simultaneously etching and removing the partial via opened hard mask layer within both the trench area and the via area prior to partially etching the dielectric layer within the via area.

14. A method for forming a dual damascene opening, comprising the steps of:
   providing a structure having an exposed conductive structure formed therein;
   forming an etch stop layer over the structure and the exposed conductive structure;
   forming a dielectric layer over the etch stop layer;
   forming a hard mask layer over the dielectric layer;
   patterning the hard mask layer to form a partially opened hard mask layer; the partially opened hard mask layer having a trench area and a via area;
   patterning the partially opened hard mask layer within the via area to form a partial via opened hard mask layer;
   simultaneously etching and removing the partial via opened hard mask layer within both the trench area and the via area, and partially etching the dielectric layer within the via area forming a partially opened dielectric layer, to: expose a portion of dielectric layer within the trench area; and form a partial via within the partially opened dielectric layer;
   etching the partially opened dielectric layer: within the trench area to form a trench; and within the via area to form a final via exposing a portion of etch stop layer; the trench and the final via forming the dual damascene opening; and
   removing the exposed etch stop layer portion to expose a portion of the conductive structure within the via opening.

15. The method of claim 14, wherein the structure is a semiconductor substrate and the exposed conductive structure is a metal line or a metal via.

16. The method of claim 14, wherein the exposed conductive structure is comprised of a material selected from the group consisting of: Cu, Al Au and Ag; the etch stop layer is comprised of a material selected from the group consisting of: nitride, silicon nitride, oxynitride, silicon oxynitride and silicon carbide; the dielectric layer is comprised of a material selected from the group consisting of: silicon oxide, silicon oxynitride and silicon nitride; and the hard mask layer is comprised of a material selected from the group consisting of: oxynitride, silicon oxynitride, carbide, nitride, silicon nitride and SiC.

17. The method of claim 14, wherein the exposed conductive structure is comprised Cu; the etch stop layer is comprised of SiN; the dielectric layer is comprised of silicon oxide; and the hard mask layer is comprised of a material selected from the group consisting of: SiON and SiC.

18. The method of claim 14, wherein the etch stop layer has a thickness of from about 200 to 600 Å; the dielectric layer has a thickness of from about 3000 to 8000 Å; and the hard mask layer has a thickness of from about 2000 to 5000 Å.

19. The method of claim 14, wherein the etch stop layer has a thickness of from about 300 to 500 Å; the dielectric layer has a thickness of from about 5000 to 7000 Å; and the hard mask layer has a thickness of from about 3000 to 4000 Å.

20. The method of claim 14, wherein the dielectric layer is porous or non-porous.

21. The method of claim 14, wherein the dielectric layer is porous.

22. The method of claim 14, wherein the dielectric layer is non-porous.

23. The method of claim 14, wherein the hard mask layer is patterned using a first patterned masking layer, and the partially opened hard mask layer is patterned using a second patterned masking layer.

24. The method of claim 14, wherein the hard mask layer is patterned using a first patterned photoresist layer, and the partially opened hard mask layer is patterned using a second patterned photoresist layer.

25. A method for forming a dual damascene opening, comprising the steps of:
   providing a structure having an exposed conductive structure formed therein;
   forming an etch stop layer over the structure and the exposed conductive structure;
   forming a dielectric layer over the etch stop layer;
   forming a hard mask layer over the dielectric layer;
   forming a first patterned masking layer over the hard mask layer leaving exposed a portion of the hard mask layer; the exposed portion of the hard mask layer having a trench area and a via area;
   patterning the hard mask layer using the first patterned masking layer as a mask to form a partially opened hard mask layer;
   removing the first patterned masking layer;
   forming a second patterned masking layer over the partially opened hard mask layer leaving exposed a portion of the partially opened hard mask layer within the via area;
   patterning the partially opened hard mask layer within the via area using the second patterned masking layer as a mask to form a partial via opened hard mask layer;

removing the second patterned masking layer;

simultaneously etching and removing the partial via opened hard mask layer within both the trench area and the via area, and partially etching the dielectric layer within the via area forming a partially opened dielectric layer, to: expose a portion of dielectric layer within the trench area; and form a partial via within the partially opened dielectric layer; and etching the partially opened dielectric layer: within the trench area to form a trench; and within the via area to form a final via exposing a portion of etch stop layer; the trench and the final via forming the dual damascene opening.

26. The method of claim 25, including the step of removing the exposed etch stop layer portion to expose a portion of the conductive structure within the via opening.

27. The method of claim 25, wherein the structure is a semiconductor substrate and the exposed conductive structure is a metal line or a metal via.

28. The method of claim 25, wherein the exposed conductive structure is comprised of a material selected from the group consisting of: Cu, Al Au and Ag; the etch stop layer is comprised of a material selected from the group consisting of: nitride, silicon nitride, oxynitride, silicon oxynitride and silicon carbide; the dielectric layer is comprised of a material selected from the group consisting of: silicon oxide, silicon oxynitride and silicon nitride; the hard mask layer is comprised of a material selected from the group consisting of: oxynitride, silicon oxynitride, carbide, nitride, silicon nitride and SiC; the first patterned masking layer is comprised of photoresist; and the second patterned masking layer is comprised of photoresist.

29. The method of claim 25, wherein the exposed conductive structure is comprised Cu; the etch stop layer is comprised of SiN; the dielectric layer is of silicon oxide; the hard mask layer is comprised of a material selected from the group consisting of: SiON and SiC; the first patterned masking layer is comprised of photoresist; and the second patterned masking layer is comprised of photoresist.

30. The method of claim 25, wherein the etch stop layer has a thickness of from about 200 to 600 Å; the dielectric layer has a thickness of from about 3000 to 8000 Å; and the hard mask layer has a thickness of from about 2000 to 5000 Å.

31. The method of claim 25, wherein the etch stop layer has a thickness of from about 300 to 500 Å; the dielectric layer has a thickness of from about 5000 to 7000 Å; and the hard mask layer has a thickness of from about 3000 to 4000 Å.

32. The method of claim 25, wherein the dielectric layer is porous or non-porous.

33. The method of claim 25, wherein the dielectric layer is porous.

34. The method of claim 25, wherein the dielectric layer is non-porous.

* * * * *